(12) United States Patent
Song et al.

(10) Patent No.: US 7,843,051 B2
(45) Date of Patent: Nov. 30, 2010

(54) SEMICONDUCTOR PACKAGE AND METHOD OF FABRICATING THE SAME

(75) Inventors: In-Sang Song, Chungcheongam-do (KR); In-Ku Kang, Gyeonggi-do (KR); Kyung-Man Kim, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 148 days.

(21) Appl. No.: 12/212,566

(22) Filed: Sep. 17, 2008

(65) Prior Publication Data
US 2009/0085184 A1    Apr. 2, 2009

(30) Foreign Application Priority Data
Sep. 28, 2007    (KR) .................. 10-2007-0098403

(51) Int. Cl.
*H01L 23/02* (2006.01)
(52) U.S. Cl. ............... 257/686; 257/685; 257/E25.005; 257/E25.006; 257/E25.021; 257/E25.027; 257/E23.085
(58) Field of Classification Search ............ 257/685, 257/686, 723, 777, E25.005, E25.006, E25.021, 257/E25.027, E23.085; 438/109, FOR. 368, 438/FOR. 426
See application file for complete search history.

(56) References Cited

U.S. PATENT DOCUMENTS

| | | | | |
|---|---|---|---|---|
| 4,996,587 A | * | 2/1991 | Hinrichsmeyer et al. .... | 257/676 |
| 5,281,852 A | * | 1/1994 | Normington ................ | 257/685 |
| 5,313,096 A | * | 5/1994 | Eide .......................... | 257/686 |
| 5,835,988 A | * | 11/1998 | Ishii ........................... | 257/684 |
| 6,281,577 B1 | * | 8/2001 | Oppermann et al. ........ | 257/724 |
| 6,703,651 B2 | * | 3/2004 | Worz et al. .................. | 257/209 |
| 7,126,829 B1 | * | 10/2006 | Yen ............................. | 361/803 |

FOREIGN PATENT DOCUMENTS

JP    61-101067    *    5/1986 ................. 257/686

* cited by examiner

*Primary Examiner*—Jasmine J Clark
(74) *Attorney, Agent, or Firm*—Muir Patent Consulting, PLLC

(57) ABSTRACT

Provided are a semiconductor device and a method of fabricating the same, and more particularly, a semiconductor package and a method of fabricating the semiconductor package. The semiconductor package includes a first package that comprises a first substrate, at least one first semiconductor chip stacked on the first substrate, and first conductive pads exposed on a top surface of the first substrate; a second package disposed below the first package such that the second package comprises a second substrate, at least one second semiconductor chip, and second conductive pads exposed on a bottom surface of the second substrate; and a connection unit that extends from the first conductive pads to the second conductive pads such that the connection unit covers a side surface of the first package and a side surface of the second package in order to electrically connect the first package to the second package.

16 Claims, 6 Drawing Sheets

A_1

A_2

SEMICONDUCTOR PACKAGE AND METHOD OF FABRICATING THE SAME

CROSS-REFERENCE TO RELATED PATENT APPLICATION

This application claims priority under 35 USC §119 to Korean Patent Application No. 10-2007-0098403, filed on Sep. 28, 2007 in the Korean Intellectual Property Office, the disclosure of which is incorporated herein in its entirety by reference.

BACKGROUND

1. Technical Field

The present invention relates to a semiconductor device and a method of fabricating the same, and more particularly, to a semiconductor package and a method of fabricating the same.

2. Description of the Related Art

Recently, the production of Package-on-package (PoP) products, in which multiple packages are stacked, has increased to meet demand for miniaturization and desired functionality of mobile electronic devices. Conventionally, a semiconductor package that performs one function is mounted in each of the mobile electronic devices. Also, in order to realize high capacity and multi-functional products, products that perform more than two package functions in one package size, by stacking multiple packages that perform different functions, for example, have been increasingly produced.

FIGS. 1A through 1C are cross-sectional views of a conventional PoP structure. More specifically, FIG. 1A is a cross-sectional view of an upper package 10a of the conventional PoP structure, and FIG. 1B is a cross-sectional view of a lower package 10b of the conventional PoP structure.

Referring to FIG. 1A, in the upper package 10a, more than one semiconductor chip 12a is stacked on a substrate 11a by interposing adhesion layers 13a therebetween. The semiconductor chips 12a are electrically connected to the substrate 11a by bonding wires 14a. A sealing member 15a that seals the semiconductor chips 12a and the bonding wires 14a is formed on an entire top surface of the substrate 11a. Solder balls 16a are formed on a bottom surface of the substrate 11a to electrically connect the substrate 11a to external elements outside of the upper package 10a.

Referring to FIG. 1B, in the lower package 10b, more than one semiconductor chip 12b is stacked on a substrate 11b by interposing adhesion layers 13b therebetween. The semiconductor chips 12b are electrically connected to the substrate 11b by bonding wires 14b. A sealing member 15b that seals the semiconductor chips 12b and the bonding wires 14b is formed on a top surface of the substrate 11b. If the size of the semiconductor chips 12b is small, the sealing member 15b may not cover the entire top surface of the substrate 11b. Solder balls 16b are formed on a bottom surface of the substrate 11b to electrically connect the substrate 11b to external elements outside of the lower package 10b.

FIG. 1C is a cross-sectional view of the conventional PoP structure.

Referring to FIG. 1C, the upper package 10a is stacked on the lower package 10b. It is unfavorable to stack the upper package 10a on the lower package 10b since an overall height of the conventional PoP is increased. The upper package 10a and the lower package 10b are electrically connected to each other by contacting the solder balls 16a of the upper package 10a with the top surface of the substrate 11b of the lower package 10b. Also, the solder balls 16b of the lower package 10b can be electrically connected to external elements. Thus, the upper package 10a is supported by its solder balls 16a, which are on the substrate 11b of the lower package 10b, and thus, an overall structure is structurally weak. That is, a crack or a bending phenomenon can occur in the substrate 11b of the lower package 10b due to an external impact or weight.

FIG. 2A is an electron microscope picture of a crack generated in a conventional PoP structure, and FIG. 2B is a photo image of a bending phenomenon in a conventional PoP structure.

Referring to FIG. 2A, the figure shows that the crack occurs in a region A_1 of a substrate of a lower package due to an external impact. Referring to FIG. 2B, the figure shows that the bending occurs in a region A_2 of a substrate of a lower package when there is an external impact.

In order to prevent the substrate from cracking and bending, the thickness of the substrate of the lower package can be increased or a sealing member can be formed to cover an entire top surface of the substrate of the lower package, however, these methods undesirably increase an overall height of the entire conventional PoP.

SUMMARY

To address the above and/or other problems, the present invention provides a semiconductor package with reduced overall height and which can prevent a substrate of a lower package from cracking and bending, and a method of fabricating the semiconductor package.

According to an aspect of the present invention, there is provided a semiconductor package including a first package that comprises a first substrate, at least one first semiconductor chip stacked on the first substrate, and first conductive pads exposed on a top surface of the first substrate; a second package disposed below the first package such that the second package comprises a second substrate, at least one second semiconductor chip, and second conductive pads exposed on a bottom surface of the second substrate; and a connection unit that extends from the first conductive pads to the second conductive pads such that the connection unit covers a side surface of the first package and a side surface of the second package in order to electrically connect the first package to the second package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1A:
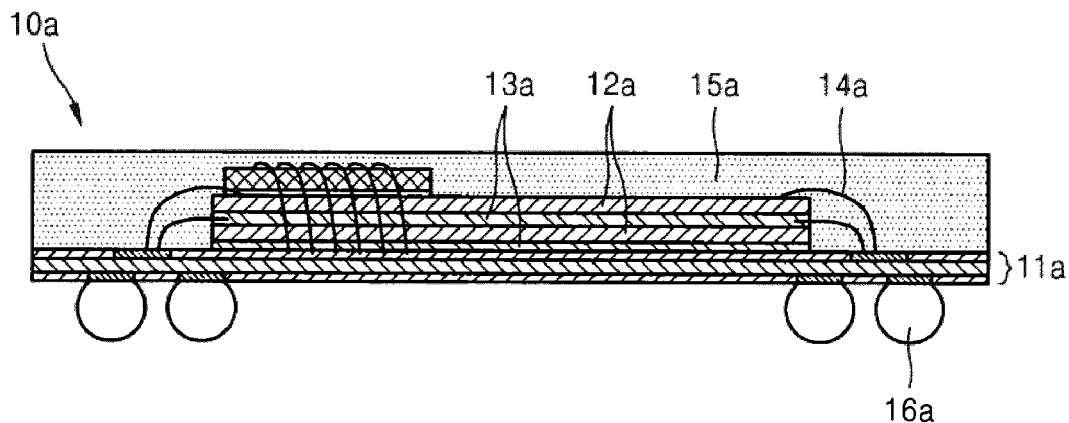
FIG. 1A is a cross-sectional view of an upper package of a conventional Package-on-package (PoP) structure.
Figure 1B:
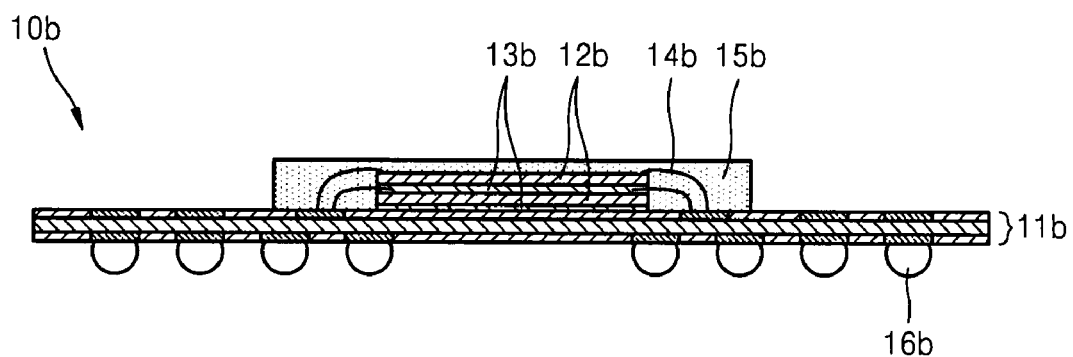
FIG. 1B is a cross-sectional view of a lower package of the conventional PoP structure.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one skilled in the art. In the drawings, the thicknesses of layers and regions are exaggerated for clarity.

Like reference numerals in the drawings denote like elements, and thus their description will be omitted. It will also be understood that when a layer is referred to as being "on" another layer or substrate, it can be directly on the other layer or substrate, or intervening layers may also be present. Also, spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below.

Figure 3A:
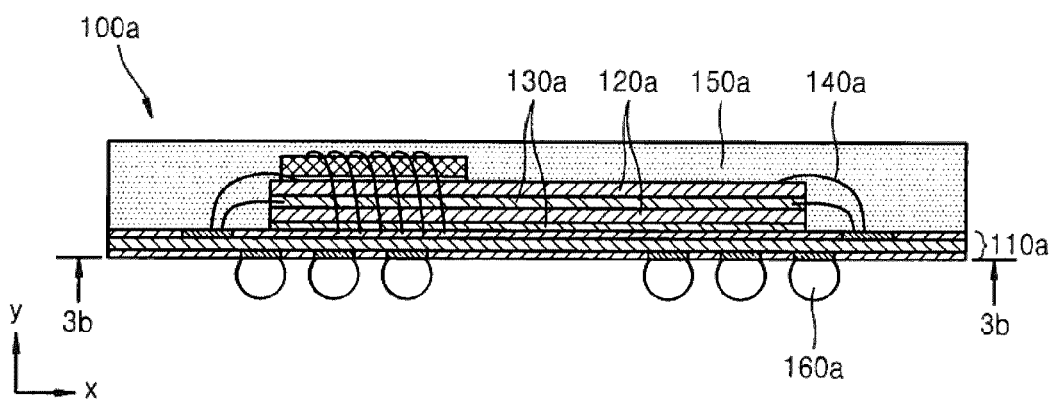
FIG. 3A is a cross-sectional view of a lower package of a semiconductor package structure, according to an embodiment of the present invention.
Figure 3B:
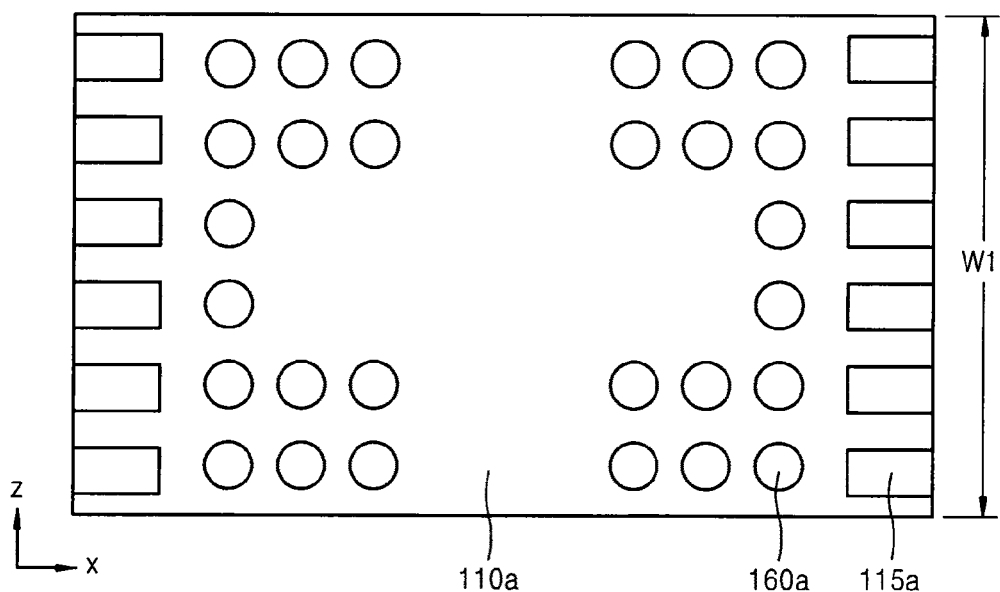
FIG. 3B is a bottom view taken along line 3b-3b of FIG. 3A, according to an embodiment of the present invention.

FIG. 3A is a cross-sectional view of a lower package 100a of a semiconductor package structure, according to an embodiment of the present invention. FIG. 3B is a bottom view of the lower package 100a of the semiconductor package structure, according to an embodiment of the present invention.

Figure 1C:
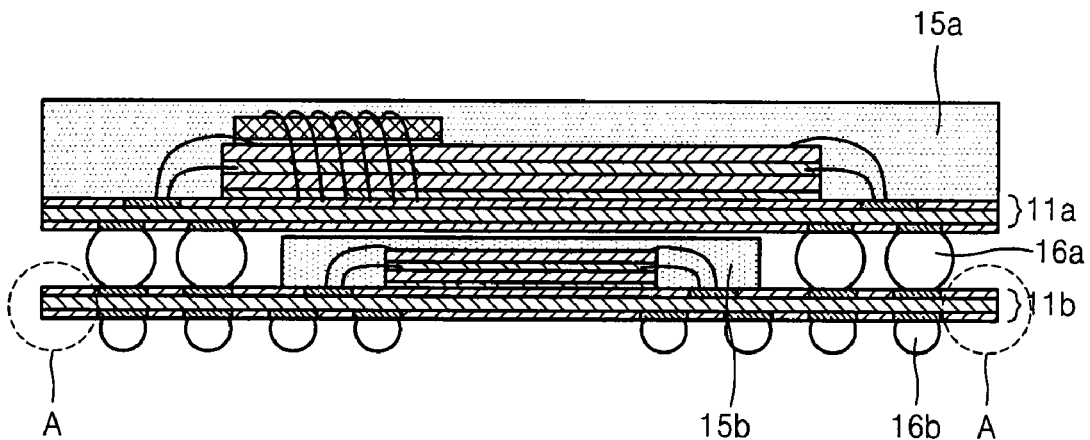
FIG. 1C is a cross-sectional view of the conventional PoP structure.
Figure 2A:
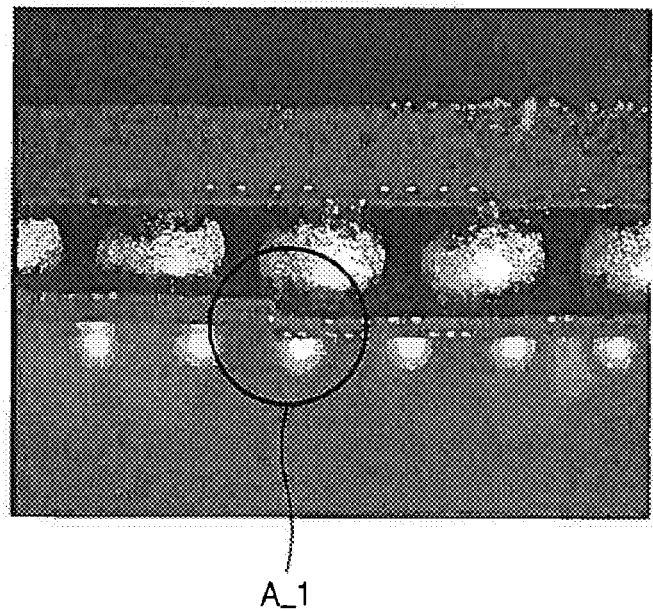
FIG. 2A is a photo image of a crack generated in a conventional PoP structure.
Figure 2B:
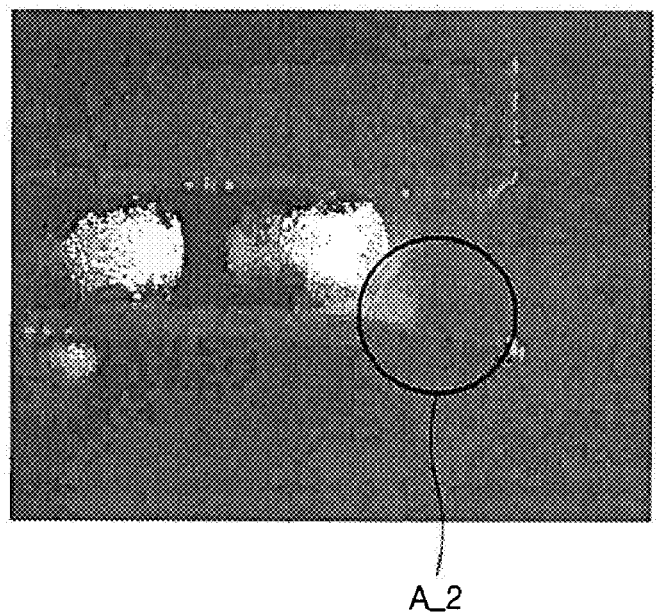
FIG. 2B is a photo image of a bending phenomenon in a conventional PoP structure.

Referring to FIG. 3A, in the lower package 100a, more than one semiconductor chip 120a is sequentially stacked on a substrate 110a by interposing adhesion layers 130a therebetween. For convenience of explanation, a long side direction of the substrate 110a is defined as being in an x direction, and a height direction of the substrate 110a is defined as being in a y direction. In this case, a short side direction of the substrate 110a is defined as being in a z direction. The semiconductor chips 120a are electrically connected to the substrate 110a by bonding wires 140a. A sealing member 150a is formed on the substrate 110a to encapsulate the semiconductor chips 120a and the bonding wires 140a. In the lower package 100a, the sealing member 150a may be formed to cover substantially the entire top surface of the substrate 110a, which is different than the prior art as shown in FIG. 1C. For example, in the prior art of FIG. 1C, if the sealing member 15b of the lower package 10b covers a portion of the top surface of the substrate 11b, an external weight applied to the upper package 10a is concentrated on a portion of the substrate 11b that is not covered by the sealing member 15b. As a result, the semiconductor package of the prior art is structurally weak. The sealing member 150a may be an epoxy mold compound (EMC), which is an epoxy group. The substrate 110a can be a printed circuit board (PCB) or a circuit tape. External connection terminals such as solder balls 160a, formed on a bottom surface of the substrate 110a, electrically connect the substrate 110a to external elements or external devices.

Referring to FIG. 3B, which is a bottom view taken along line 3b-3b of FIG. 3A, second conductive pads 115a are formed on a lower surface of the substrate 110a. The second conductive pads 115a can be electrically connected to the semiconductor chips 120a through the substrate 110a. Also, the second conductive pads 115a can be electrically connected to external elements or external devices (for example, an upper package). The second conductive pads 115a are disposed along the short side of the substrate 110a, where the short side of the substrate 110a is defined as the z direction, which is perpendicular to the x and y directions as depicted in FIG. 3A.

Figure 4A:
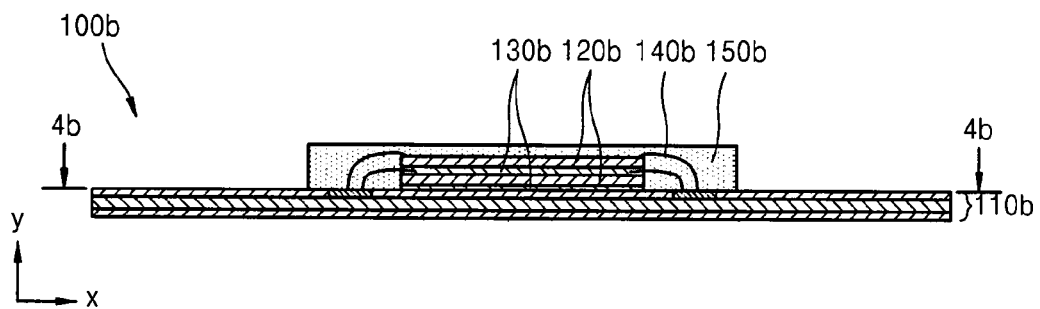
FIG. 4A is a cross-sectional view of an upper package of a semiconductor package structure, according to an embodiment of the present invention.
Figure 4B:
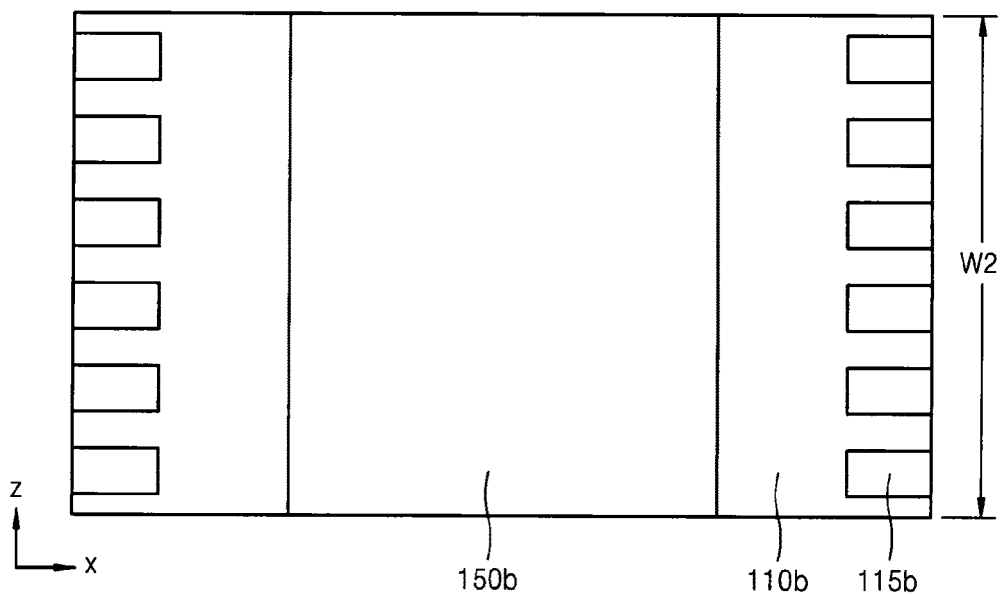
FIG. 4B is a bottom view taken along line 3b-3b of FIG. 4A, according to an embodiment of the present invention.

FIG. 4A is a cross-sectional view of an upper package 100b of the semiconductor package structure, according to an embodiment of the present invention. FIG. 4B is a top view taken along line 4b-4b of FIG. 4A, according to an embodiment of the present invention.

Referring to FIG. 4A, in the upper package 100b, more than one semiconductor chip 120b is sequentially stacked on a substrate 110b by interposing adhesion layers 130b between the semiconductor chips 120b. For convenience of explanation, a long side direction of the substrate 110b is defined as being in an x direction, and a height direction of the substrate 110b is defined as being in a y direction. In this case, a short side direction of the substrate 110b is defined as being in a z direction (refer to FIG. 4B). The semiconductor chips 120b are electrically connected to the substrate 110b through bonding wires 140b. A sealing member 150b is formed on the substrate 110b to seal the semiconductor chip groups 120b and the bonding wires 140b. In the upper package 100b, the sealing member 150b, unlike in the lower package 100a, is formed so as not to cover an entire top surface of the substrate 110b, but instead cover a portion of the top surface of the substrate 110b. The sealing member 150b may be an epoxy mold compound (EMC), which is an epoxy group. The substrate 110b can be a printed circuit board (PCB) or a circuit tape. Additionally, note that solder balls, for electrically connecting the substrate 110b to the lower package 100a, are not formed on a bottom surface of the substrate 110b.

Referring to FIG. 4B, which is a top view taken along line 4b-4b of FIG. 4A, first conductive pads 115b are formed on the top surface of the substrate 110b such that the first conductive pads 115b are disposed along the z direction. The first conductive pads 115b can be electrically connected to the semiconductor chips 120b through the substrate 110b. Also, the first conductive pads 115b can be electrically connected to external elements or external devices (for example, the lower package). The first conductive pads 115b are disposed along the short side of the substrate 110b. The short side of the substrate 110b is defined as the z direction which is perpendicular to the x and y directions depicted in FIG. 4A.

Figure 5A:
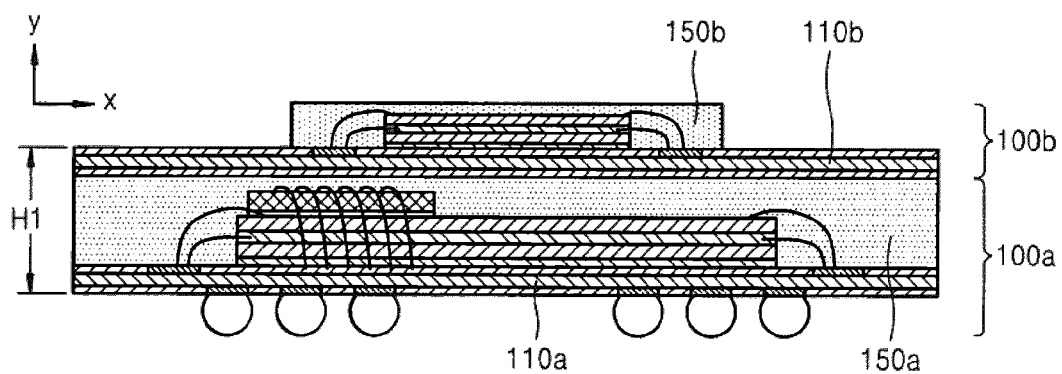
FIG. 5A is a cross-sectional view of a portion of a semiconductor package, according to an embodiment of the present invention.
Figure 5B:
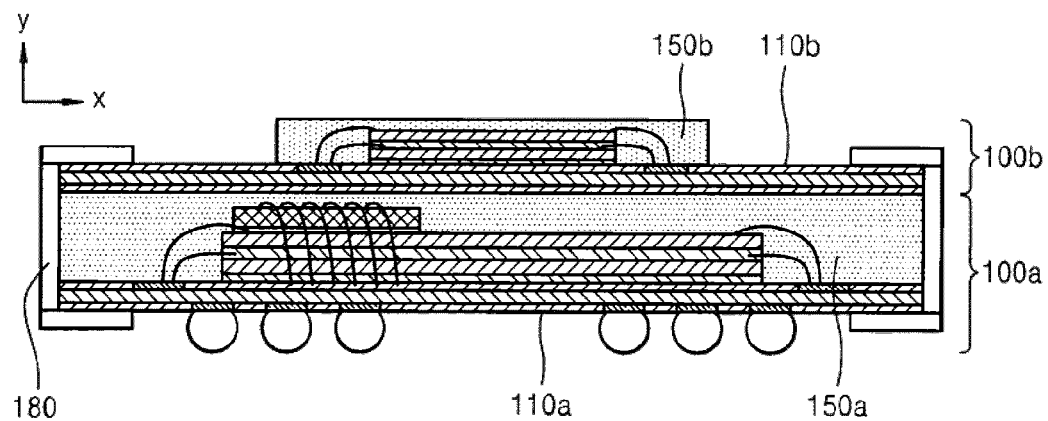
FIG. 5B is a cross-sectional view of the semiconductor package, according to an embodiment of the present invention.

FIG. 5A is a cross-sectional view of a portion of the semiconductor package according to an embodiment of the present invention, and FIG. 5B is a cross-sectional view of the semiconductor package according to an embodiment of the present invention.

Referring to FIG. 5A, the upper package 100b of FIG. 4A is stacked on the lower package 100a of FIG. 3A. According to the present embodiment of the present invention, the substrate 110b of the upper package 100b directly contacts the sealing member 150a of the lower package 100a. However, according to another embodiment of the present invention, an adhesion layer (not shown) can be interposed between the substrate 110b of the upper package 100b and the sealing member 150a of the lower package 100a.

Referring to FIG. 5B, a connection unit 180 that electrically connects the upper package 100b with the lower package 100a is disposed on a side of the upper package 100b and the lower package 100a. More specifically, the connection unit 180 extends to correspondingly cover the first conductive pads 115b (FIG. 4B) of the upper package 100b, a side surface of the substrate 110b of the upper package 100b, a side surface of the sealing member 150a of the lower package 100a, a side surface of the substrate 110a of the lower package 100a, and the second conductive pads 115a (FIG. 3B) of the lower package 100a. In this way the first conductive pads 115b of the upper package 100b can be electrically connected to the second conductive pads 115a of the lower package 100a.

Figure 6A:
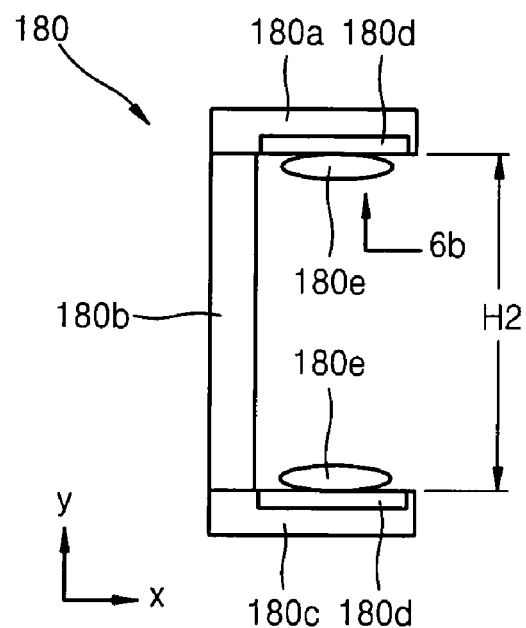
FIGS. 6A and 6B are a cross-sectional view and a plan view, respectively, of connection units of the semiconductor package, according to an embodiment of the present invention.

FIG. 6A is a cross-sectional view of the connection unit 180. Referring to FIG. 6A, the connection unit 180 includes first, second, and third main body units 180a, 180b, and 180c and electrode pads 180d. (the connection unit 180 has three main body units, that is, the first, second, and third main body units 180a, 180b, and 180c, such that the first main body unit 180a covers the first conductive pads 115b of the upper package 100b, the second main body unit 180b covers the side surface of the substrate 110b of the upper package 100b, the side surface of the sealing member 150a of the lower package 100a, and the side surface of the substrate 110a of the lower package 100a, and the third main body unit 180c correspondingly covers the second conductive pads 115a of the lower package 100a). The electrode pads 180d of the first and third main body units 180a and 180c are formed of a conductive material, and disposed to respectively contact with the first conductive pads 115b of the upper package 100b and the second conductive pads 115a of the lower package 100a. The electrode pads 180d of the first and third main body units 180a and 180c are electrically connected to each other through a wire (not shown) formed in the first, second, and third main body units 180a, 180b, and 180c. Thus, the upper package 100b and the lower package 100a can be electrically connected to each other even though there are no solder balls between the upper package 100b and the lower package 100a.

The first main body 180a extends in the x direction to contact the top surface of the substrate 110b of the upper package 100b, the second main body 180b extends in the y direction to contact side surfaces of the upper package 100b and the lower package 100a, and the third main body 180c extends in the x direction to contact the bottom surface of the substrate 110a of the lower package 100a. More specifically, the second main body 180b contacts the side surface of the substrate 110b of the upper package 100b, the side surface of the conductive sealing member 150a, and the side surface of the substrate 110a of the lower package 100a. Also, the connection unit 180 can further include solder balls 180e interposed between the first conductive pads 115b of the upper package 100b and the electrode pads 180d of the first main body 180a. Additionally, the connection unit 180 can further include solder balls 180e interposed between the second conductive pads 115a of the lower package 100a and the electrode pads 180d of the third main body 180c. If the connection unit 180 includes such solder balls 180e, the first conductive pads 115b of the upper package 100b and the second conductive pads 115a of the lower package 100a may be respectively attached to the electrode pads 180d of the first main body 180a and the third main body 180c by applying heat and/or physical pressure to the solder balls 180e. One skilled in the art would understand that the electrode pads 180d of the first main body 180a and the third main body 180c can be electrically connected to the first conductive pads 115b of the upper package 100b and the second conductive pads 115a of the lower package 100a by direct contact. The connection unit 180 can also be combined with the upper package 100b and the lower package 100a using various other methods.

As an example of connecting the connection unit 180 to the upper package 100b and the lower package 100a, after stacking the upper package 100b on the lower package 100a, the connection unit 180 can be combined with the upper package 100b and the lower package 100a by attaching an assembled connection unit 180 to sides of the upper package 100b and the lower package 100a. In this case, the first, second, and third main body units 180a, 180b, and 180c of the connection unit 180 may be formed of an elastic material. That is, the first, second, and third main body units 180a, 180b, and 180c may have elasticity so that the first main body 180a can contact the top surface of the substrate 110b of the upper package 100b, and the third main body 180c can contact the bottom surface of the substrate 110a of the lower package 100a by attaching the connection unit 180 to the sides of the upper package 100b and the lower package 100a. A gap H2 between the first main body unit 180a and the third main body unit 180c is substantially the same as the height of the second main body unit 180c, and may be substantially equal to the sum of the height of the substrate 110b of the upper package 100b, the height of the first conductive pads 115b of the upper package 100b, the height of the second conductive pads 115a of the lower package 100a, the height of the sealing member 150a, and the height of the substrate 110a of the lower package 100a (cumulatively, H1 of FIG. 5A).

As another example of connecting the connection unit 180 to the upper package 100b and the lower package 100a, after stacking the upper package 100b on the lower package 100a, the electrode pads 180d of the first and third main body units 180a and 180c, and the first, second, and third main body units 180a, 180b, and 180c can be sequentially formed using a conventional method such as plating, coating, and/or deposition. In this case, the first, second, and third main body units 180a, 180b, and 180c are not formed of an elastic material.

Figure 6B:
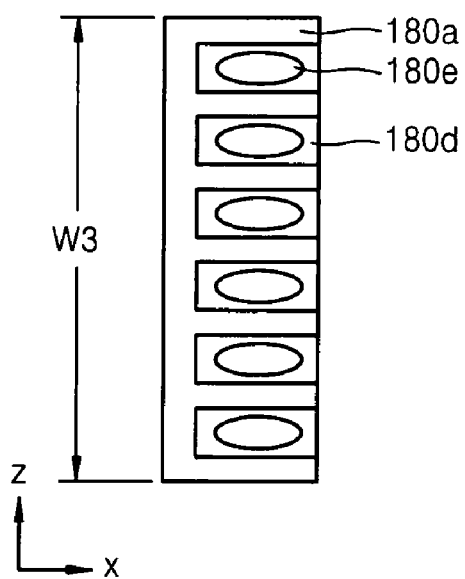

FIG. 6B is a plan view of the connection unit 180 as viewed from a direction indicated by the arrow 6b of FIG. 6A. Also, the second conductive pads 115a of the lower package 100a are disposed on the bottom surface of the substrate 110a of the lower package 100a in a short side direction (the z direction), and the first conductive pads 115b of the upper package 100b are disposed (refer to FIG. 4B) in a short side direction (the z direction) of the top surface of the substrate 110b of the upper package 100b, such that the first conductive pads 115b correspond to the second conductive pads 115a. In this case, the electrode pads 180d and/or the solder balls 180e of the first and third main body units 180a and 180c are disposed parallel to each other so that the electrode pads 180d of the first and third main body units 180a and 180c and/or the solder balls 180e respectively contact the first conductive pads 115b and the second conductive pads 115a. A width W3 of the first main body unit 180a can be substantially the same as a width W1 (refer to FIG. 3B) of the substrate 110 of the lower package 100a, and/or substantially the same as a width W2 (refer to FIG. 4B) of the substrate 110b of the upper package 110b, in the z direction.

According to an aspect of the present invention, there is provided a semiconductor package including a first package that comprises a first substrate, at least one first semiconductor chip stacked on the first substrate, and first conductive pads exposed on a top surface of the first substrate; a second package disposed below the first package such that the second package comprises a second substrate, at least one second semiconductor chip, and second conductive pads exposed on a bottom surface of the second substrate; and a connection unit that extends from the first conductive pads to the second conductive pads such that the connection unit covers a side surface of the first package and a side surface of the second package in order to electrically connect the first package to the second package.

The connection unit may include first, second and third main body units and electrode pads formed on the first and third main body units. The electrode pads of the first and third main body units may be formed of a conductive material, and be disposed to respectively contact the first conductive pads and the second conductive pads. The electrode pads of the first and third main body units may be electrically connected to the first conductive pads and the second conductive pads, respectively, through wirings formed in the first, second, and third main body units.

The connection unit may further include solder balls interposed between the first conductive pads and the second conductive pads. The connection unit may further include solder balls interposed between the second conductive pads and the electrode pads. The first, second, third main body units may be formed of an elastic material.

The first package may further include a first sealing member that seals the first semiconductor chip, exposes the first conductive pads, and is formed on a portion of the first substrate, and the second package further comprises a second sealing member that seals the second semiconductor chip and is formed on the second substrate.

The second sealing member may seal an entire top surface of the second substrate. The first substrate may directly contact the second sealing member. The semiconductor package may further include an adhesion layer interposed between the first substrate and the second sealing member.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A semiconductor package comprising:
a first package that comprises a first substrate, at least one first semiconductor chip stacked on the first substrate, and first conductive pads disposed on a top surface of the first substrate;
a second package disposed below the first package, the second package including a second substrate, at least one second semiconductor chip, and second conductive pads disposed on a bottom surface of the second substrate; and
a connection unit that extends from the first conductive pads to the second conductive pads such that the connection unit covers a side surface of the first package and a side surface of the second package and electrically connects the first package to the second package,
wherein the connection unit comprises first, second and third main body units and electrode pads disposed on the first and third main body units.

2. The semiconductor package of claim 1, wherein the electrode pads of the first and third main body units comprise a conductive material and are disposed to respectively contact the first conductive pads and the second conductive pads.

3. The semiconductor package of claim 2, wherein the electrode pads of the first and third main body units are electrically connected through wirings disposed in the first, second and third main body units.

4. The semiconductor package of claim 1, wherein the connection unit further comprises solder balls interposed between the electrode pads and the first conductive pads.

5. The semiconductor package of claim 1, wherein the connection unit further comprises solder balls interposed between the second conductive pads and the electrode pads.

6. The semiconductor package of claim 1, wherein the first, second, and third main body units comprise an elastic material.

7. The semiconductor package of claim 1, wherein the electrode pads of the first and third main body units directly contact the first conductive pads and the second conductive pads.

8. The semiconductor package of claim 1, wherein
the first main body unit contacts top surface of the first substrate;
the second main body unit contacts the side surface of the first substrate and a side surface of the second package; and
the third main body unit contacts a bottom surface of the second substrate.

9. The semiconductor package of claim 1, wherein the first conductive pads disposed on the top surface of the first substrate respectively correspond to the second conductive pads on the bottom surface of the second substrate.

10. The semiconductor package of claim 9, wherein the electrode pads of the first and third main body units respectively contact the first conductive pads and the second conductive pads.

11. The semiconductor package of claim 1, wherein the first package further comprises a first sealing member that seals the first semiconductor chip, exposes the first conductive pads, and is disposed on a portion of the first substrate, and the second package further comprises a second sealing member that seals the second semiconductor chip and is disposed on the second substrate.

12. The semiconductor package of claim 11, wherein the first substrate directly contacts the second sealing member.

13. The semiconductor package of claim 11, further comprising an adhesion layer interposed between the first substrate and the second sealing member.

14. The semiconductor package of claim 11, wherein the second sealing member seals a substantially entire top surface of the second substrate.

15. The semiconductor package of claim 1, wherein at least one of the first substrate and the second substrate is a printed circuit board (PCB) or a circuit tape.

16. The semiconductor package of claim 11, wherein the second sealing member fills up substantially the entire space between the first substrate and the second substrate.

* * * * *